United States Patent
Park et al.

(10) Patent No.: US 7,405,867 B2
(45) Date of Patent: *Jul. 29, 2008

(54) MINIATURE OPTICAL MODULATOR MODULE USING FLEXIBLE PRINTED CIRCUIT BOARD

(75) Inventors: Heung-Woo Park, Suwon-si (KR); Young-Gyu Lee, Suwon-si (KR); Jong-Hyeong Song, Suwon-si (KR); Yoon-Joon Choi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 58 days.

This patent is subject to a terminal disclaimer.

(21) Appl. No.: 11/518,377

(22) Filed: Sep. 7, 2006

(65) Prior Publication Data

US 2007/0053628 A1 Mar. 8, 2007

(30) Foreign Application Priority Data

Sep. 7, 2005 (KR) ............ 10-2005-0083001
Aug. 17, 2006 (KR) ............ 10-2006-0077540

(51) Int. Cl.
*G02F 1/00* (2006.01)
*G02F 1/01* (2006.01)
*G02B 26/00* (2006.01)

(52) U.S. Cl. ............ 359/321; 359/237; 359/240; 359/290; 359/296

(58) Field of Classification Search .......... 359/237, 359/238, 240, 290, 291, 296, 321, 572, 578, 359/579

See application file for complete search history.

(56) References Cited

U.S. PATENT DOCUMENTS

| | | | | |
|---|---|---|---|---|
| 6,542,374 B1 * | 4/2003 | Muramatsu et al. | ......... | 361/760 |
| 6,617,521 B1 * | 9/2003 | Saito et al. | ......... | 174/260 |
| 6,910,812 B2 * | 6/2005 | Pommer et al. | ......... | 385/92 |
| 6,967,640 B2 * | 11/2005 | Albert et al. | ......... | 345/107 |
| 7,021,836 B2 * | 4/2006 | Anderson et al. | ......... | 385/89 |
| 2007/0053628 A1 * | 3/2007 | Park et al. | ......... | 385/14 |

* cited by examiner

*Primary Examiner*—David N Spector
(74) *Attorney, Agent, or Firm*—Christensen O'Connor Johnson Kindness PLLC

(57) ABSTRACT

An optical modulator module is disclosed, comprising a bendable flexible printed circuit board in which a circuit pattern is formed, and to which control signals are inputted from the outside; an optical modulator element modulating an incident light according to a driving voltage and sending out the modulated light; an at least partially transparent substrate through which the incident light and the modulated light pass, and in which a circuit pattern is formed; and a driving integrated circuit electrically connected with the flexible printed circuit board, and supplying the optical modulator element with the driving voltage according to the inputted control signals, the flexible printed circuit board being electrically connected with the substrate.

7 Claims, 11 Drawing Sheets

PRIOR ART

PRIOR ART

(a)

AA' Cross-section (b)

BB' Cross-section (a) AA' Cross-section (b) BB' Cross-section (a)

AA' Cross-section (b)

BB' Cross-section (c)

CC' Cross-section

MINIATURE OPTICAL MODULATOR MODULE USING FLEXIBLE PRINTED CIRCUIT BOARD

BACKGROUND

1. Technical Field

The present invention relates to an optical modulator module, more specifically, to a miniature optical modulator module employing a flexible printed circuit board for a portable device.

2. Description of the Related Art

A micro-machine refers to a miniature machine indiscernible with naked eyes. It can also be called a micro electro mechanical system (MEMS), and mainly fabricated by semiconductor manufacturing technology. These micro-machines are applied in information devices such as a magnetic and optical head by using micro-optics and limitation elements, and also applied in the bio-medical field and the semi-conductor manufacturing process by using various micro-fluidics. The micro-machines can be divided based on their function into a micro-sensor, a micro-actuator and a miniature machine.

The MEMS can also be applied in optics. Using MEMS technology, optical components smaller than 1 mm may be fabricated, by which micro optical systems may be implemented.

Conventional optical systems are comprised of a mirror, and a lens mounted on a large and heavy optical bench. The size of the lasers is also large. Significant effort is required in arranging an optical axis, reflection angle and reflection surface to obtain better performance. However, the micro-miniature optical system using MEMS technology reduces such space and efforts, and will show advanced performance.

Micro optical components belonging to the micro-miniature optical system such as a micro-mirror, a micro-lens, and the like are applied in telecommunication devices, display devices and recording devices, due to such advantages as quick response time, low level of loss, and convenience in layering and digitalizing.

As display technologies have advanced, the demand on large screen display devices has grown. The majority of current large screen display devices (mainly projectors) are using liquid crystals as a light-switcher. Such a liquid crystal projector has been popular due to the fact that it is smaller, cheaper, and has a simpler optical system than a CRT projector. However, in the liquid crystal projector, an amount of light is lost while passing through a liquid crystal panel and also projected to a screen. A micro-machine such as an optical modulator element using reflection is employed to reduce such light loss, by which brighter images are obtained.

Also, the demand for portable devices having advanced multi-media functions is increasing to play games or to enjoy DMB broadcast while traveling. The portable devices refer to small size electronic devices designed to be conveniently carried so as to be used for games and mobile communication. The portable device includes a mobile communication device, a PDA (personal digital assistant) and a PMP (personal multimedia player).

A diffraction type optical modulator element having micro-mirrors may be employed as a micro-miniature optical system in the portable device. In general, a conventional diffraction type optical modulator element has been manufactured in hybrid form, because modularizing by building a driving integrated circuit on a separate substrate produces a higher yield and is more cost-effective than integrating the driving integration circuit on the same die.

However, due to the fact that the conventional diffraction type optical modulator element, unlike other elements, uses light, the modularizing process for the diffraction type optical modulator element should be specialized from existing modularizing processes.

Besides, the micro-mirror of the conventional diffraction type optical modulator element is so weak to moisture that it should be seal packed, and the micro-mirror should be designed to discharge heat generated while the light is illuminated and the element is operating to the outside to stabilize its operation and to enhance its durability.

In FIGS. 1A and 1B are illustrated an optical modulator module for solving the aforementioned problems.

FIG. 1A is a plan view of a conventional optical modulator module, and FIG. 1B is an exploded perspective view of the conventional optical modulator module.

As shown in FIGS. 1A and 1B, the optical modulator module comprises an optical modulator element 10, a transparent substrate 20, driving integrated circuits 30a to 30d and a printed circuit board 40. The optical modulator module may further comprise a heat discharging plate and/or a connector.

A lower side of the transparent substrate 20 is attached to the printed circuit board 40. The optical modulator element 10 is attached to an upper side of the transparent substrate 20 in correspondence to a hole 45 formed on the printed circuit board 40.

The optical modulator element 10 modulates incident light inputted through the hole 45 and the transparent substrate 20, and sends out the modulated light. The optical modulator element 10 is connected by flip-chip bonding on the transparent substrate 20. The optical modulator element 10 is sealed from the outer environment since an adhesive is applied around its circumference. The optical modulator element 10 is electrically connected due to an electric wiring distributed along the surfaces of the transparent substrate 20.

The driving integrated circuits 30a to 30d are connected by flip-chip bonding near the optical modulator element 10 attached to the transparent substrate 20, and supply the optical modulator element 10 with driving power according to control signals inputted from the outside.

A first circuit pattern 21 is formed between a lower metallic pad of the optical modulator element 10 and a lower pad for the driving integrated circuit so as to transmit electric signals outputted by the driving integrated circuits 30a to 30d through the lower metallic pad to the micro-mirror of the optical modulator element 10.

A second circuit pattern 23 is formed between a lower pad for the driving integrated circuit and a wire bonding pad 22 of the transparent substrate 20 so as to transmit electric signals inputted through the wire bonding pad 22 from the printed circuit board 40 to the lower pad for the driving integration circuit.

A wire bonding pad 31 on the printed circuit board 40 is wire-bonded to the wire bonding pad 22 of the transparent substrate 20, thereby transmitting electric signals.

Since the printed circuit board 40 is made of a rigid printed circuit board, the optical modulator module illustrated in FIGS. 1A and 1B is inflexible. This inflexibility makes it difficult to mount the optical modulator module on a space smaller than the printed circuit board 40.

SUMMARY

The present invention aims to provide a bendable optical modulator module using a flexible printed circuit board.

Also, the present invention provides an optical modulator module having an optical modulator element, to which light is inputted and from which the light is sent out, fixed in a predetermined position, and driving integrated circuits free to be positioned.

Also, the present invention provides an optical modulator module which can be mounted on a limited space by employing a bendably flexible printed circuit board, thereby applicable to a portable device having a module of limited size.

One aspect of the present invention provides an optical modulator module comprising: a bendable flexible printed circuit board in which a circuit pattern is formed, and to which control signals are inputted from the outside; an optical modulator element modulating an incident light according to a driving voltage and sending out the modulated light; a transparent substrate through which the incident light and the modulated light pass, and in which a circuit pattern is formed; and a driving integrated circuit electrically connected with the flexible printed circuit board, and supplying the optical modulator element with the driving voltage according to the inputted control signals, wherein the flexible printed circuit board is electrically connected with the transparent substrate.

Here, the optical modulator element and the driving integrated circuit are attached to one side of the flexible printed circuit board, and the transparent substrate is attached to the other side of the flexible printed circuit board in correspondence with a position where the optical modulator element is attached, and a hole, through which the incident light and the modulated light pass, is formed on the part of the flexible printed circuit board to which the optical modulator element is attached.

Here, the optical modulator element and the driving integrated circuit are connected by flip-chip bonding with the flexible printed circuit board.

Also, the optical modulator element is attached to the transparent substrate, and the driving integrated circuit is attached to the flexible printed circuit board, and the circuit pattern of the transparent substrate is partly overlapped with the circuit pattern of the flexible printed circuit board.

Here, the overlapped part is electrically connected by means of an anisotropic conductive film (ACF), a nonconductive film (NCF), or soldering.

Also, the optical modulator element and the driving integrated circuit are attached to the transparent substrate, and the circuit pattern of the transparent substrate is overlapped with the circuit pattern of the flexible printed circuit board on a predetermined part.

Here, the overlapped part is electrically connected by means of an anisotropic conductive film (ACF), a nonconductive film (NCF), or soldering.

Also, the driving integrated circuit has input terminals to which the control signals are inputted and output terminals through which the driving voltage is outputted, wherein the output terminals outnumber the input terminals, and the input terminals are connected to the circuit pattern formed on the flexible printed circuit board, and the output terminals are connected to the circuit pattern formed on the transparent substrate.

Additional aspects and advantages of the present invention will be set forth in part in the description which follows and, in part, will be apparent from the description, or may be learned by practice of the invention.

DESCRIPTION OF THE DRAWINGS

These and other features, aspects, and advantages of the present invention will become better understood with regard to the following description, appended claims, and accompanying drawings where:

DETAILED DESCRIPTION

Figure 1A:
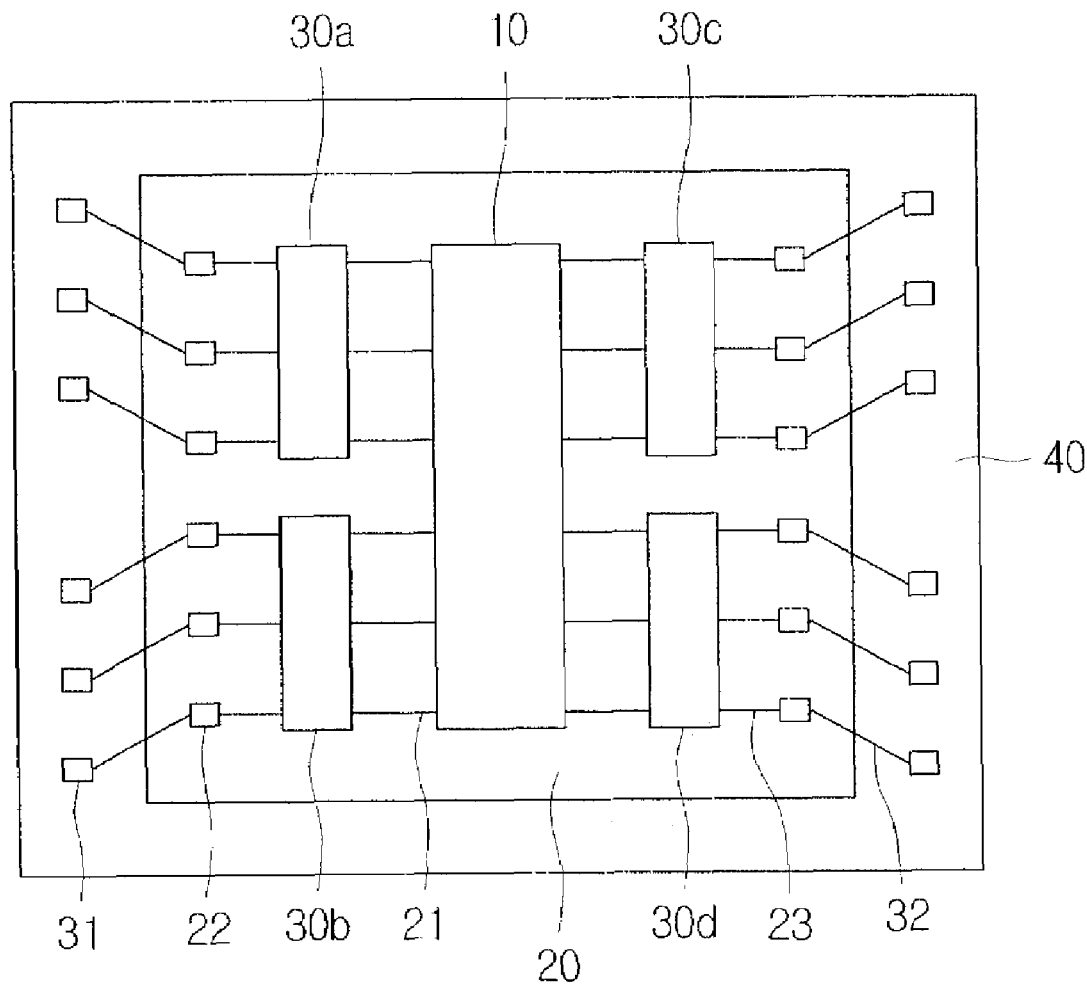
FIG. 1A is a plan view of a conventional optical modulator module.
Figure 1B:
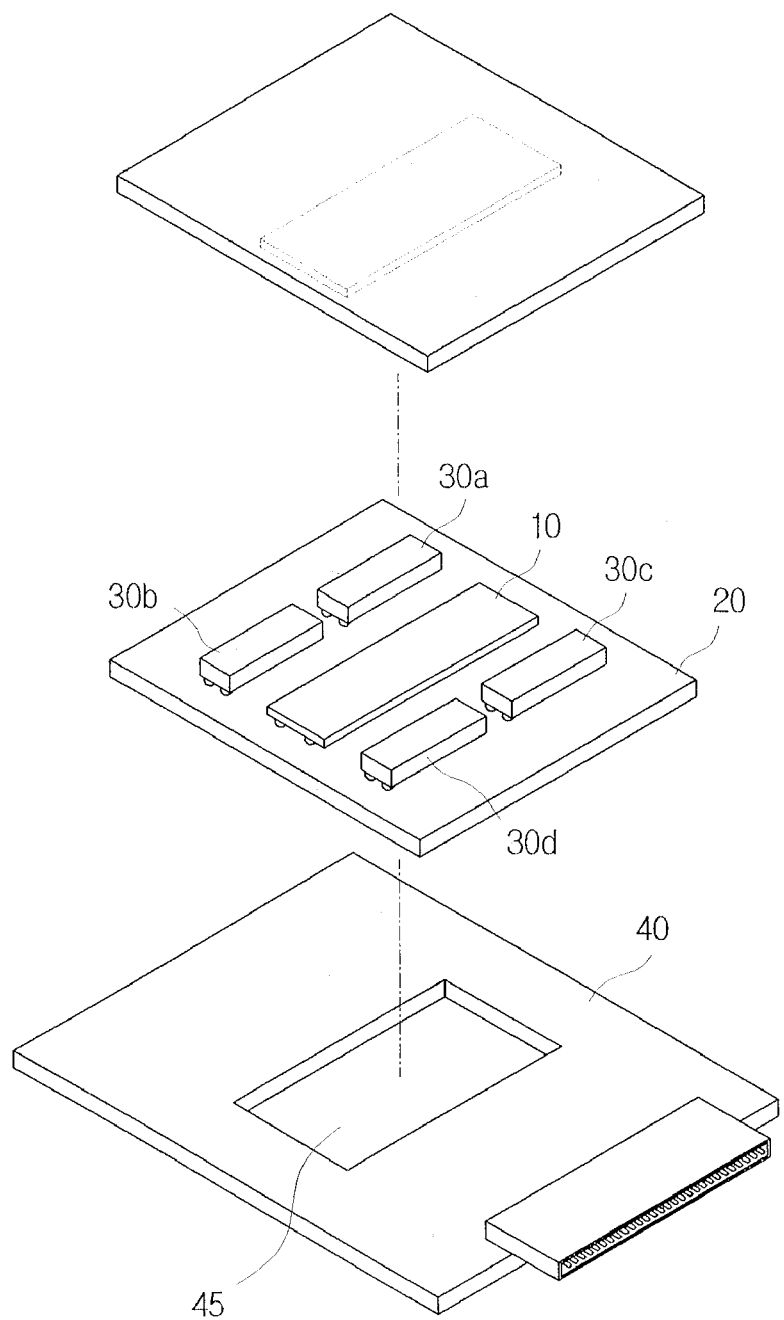
FIG. 1B is an exploded perspective view of the conventional optical modulator module.

Embodiments of the invention will now be described in more detail with reference to the accompanying drawings, wherein like reference numerals refer to the like elements throughout, and redundant explanations are omitted.

Also, an optical modulator applicable to the present invention will first be described before discussing the embodiments.

The optical modulator can be divided mainly into a direct type, which directly controls the on/off state of light, and an indirect type, which uses reflection and diffraction. The indirect type may be further divided into an electrostatic type and a piezoelectric type. Optical modulators are applicable to the embodiments of the invention regardless of the operation type.

An electrostatic type grating optical modulator disclosed in U.S. Pat. No. 5,311,360 includes a plurality of equally spaced-apart deformable reflective ribbons having reflective surfaces and suspended above the upper part of the substrate.

First, an insulation layer is deposited onto a silicon substrate, followed by the depositions of a sacrificial silicon dioxide film and a silicon nitride film. The silicon nitride film is patterned from the ribbons, and parts of the silicon dioxide film are etched so that the ribbons are maintained by the nitride frame on the oxide spacer layer.

The grating amplitude, of such a modulator limited to the vertical distance d between the reflective surface of the ribbons and the reflective surface of the substrate, is controlled by supplying voltage between the ribbons (the reflective surface of the ribbon, which acts as the first electrode) and the substrate (the conductive film at the bottom portion of the substrate, which acts as the second electrode).

Figure 2A:
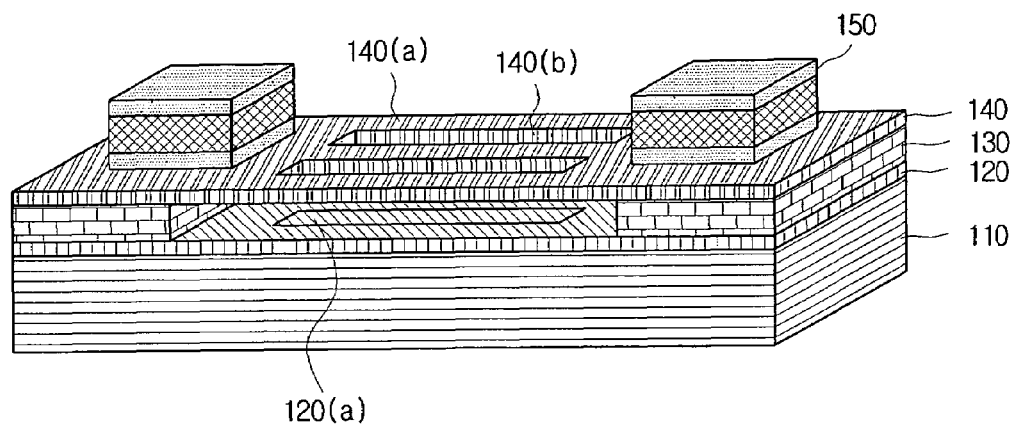
FIGS. 2A to 2D show cross-sectional views of a MEMS structure (micro-mirror) operating mechanically.
Figure 2B:
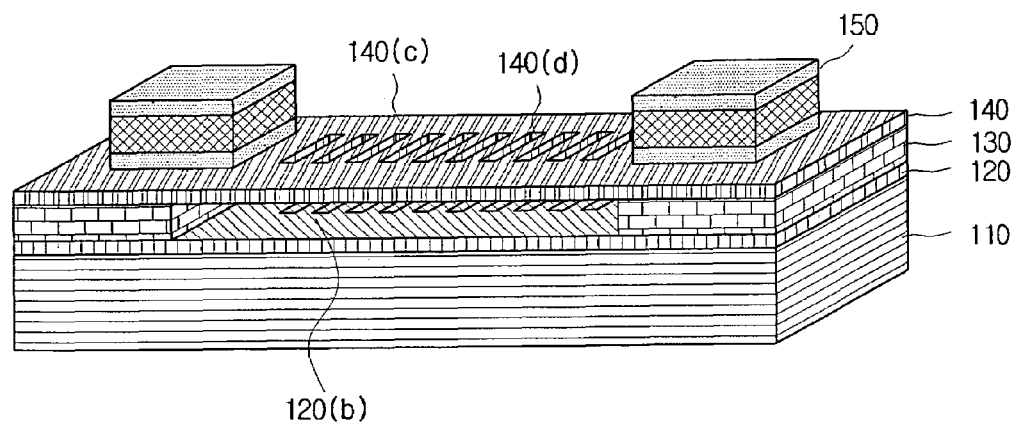

FIG. 2A is a perspective view of a diffraction type optical modulator module using piezoelectric elements, one of the indirect optical modulators applicable to an embodiment of the invention, and FIG. 2B is a perspective view of another diffraction type optical modulator module using piezoelectric elements, applicable to an embodiment of the invention. In FIGS. 2A and 2B are illustrated an optical modulator comprising a substrate 110, an insulation layer 120, a sacrificial layer 130, a ribbon structure 140 and piezoelectric elements 150.

The substrate 110 is a commonly used semiconductor substrate, and the insulation layer 120 is deposited as an etch stop layer. The insulation layer 120 is formed from a material with a high selectivity to the etchant (the etchant is an etchant gas or an etchant solution) that etches the material used as the sacrificial layer. Here, reflective layers 120(a) and 120(b) may be formed on the insulation layer 120 to reflect incident light.

The sacrificial layer 130 upholds the ribbon structure 140 at both ends of the ribbon structure 140 to leave a certain gap between the ribbon structure 140 and the insulation layer 120, and forms a space in the center part.

As described above, the ribbon structure 140 modulates signals optically by creating diffraction and interference in the incident light. The ribbon structure 140 may be composed of a plurality of ribbon shapes according to the electrostatic type, or may have a plurality of open holes in the center part of the ribbons according to the piezoelectric type. The piezoelectric elements 150 control the ribbon structure 140 to move vertically according to the degree of up/down or left/right contraction or expansion generated by the voltage difference between the upper and lower electrodes. Here, the reflective layers 120(a) and 120(b) are formed in correspondence with holes 140(b) and 140(d) formed on the ribbon structure 140.

For example, in the case where the wavelength of the light equals $\lambda$, a first voltage is applied to the piezoelectric elements 150 so that the gap between the upper reflective layer 140(a) and 140(c) formed on the ribbon structure 140 and the insulation layer 120, where the lower reflective layer 120(a) is formed, becomes equal to $(2n)\lambda/4$ (wherein n is a natural number). Accordingly, in the case of a zeroth (0th) order diffracted light (reflected light) beam, the overall path difference between the light reflected from the upper reflective layer 140(a), 140(c) formed on the ribbon structure 140 and the light reflected from the insulation layer 120 is equal to $n\lambda$, so that the modulated light has a maximum brightness due to a constructive interference. On the other hand, in the case of +1st and −1st order diffracted light, by which the brightness is at its minimum level due to a destructive interference.

A second voltage is applied to the piezoelectric elements 150 so that the gap between the upper reflective layer 140(a), 140(c) formed on the ribbon structure 140 and the insulation layer 120, where the lower reflective layer 120(a), 120(b) is formed, becomes equal to $(2n+1)\lambda/4$ (wherein n is a natural number). Accordingly, in the case of 0th-order diffracted light (reflected light) beam, the overall path difference between the light reflected from the upper reflective layer 140(a), 140(c) formed on the ribbon structure 140 and the light reflected from the insulation layer 120 is equal to $(2n+1)\lambda/2$, so that the modulated light has its minimum brightness due to a destructive interference. However, in the case of +1st and −1st order diffracted light, the brightness is at its maximum level due to a constructive interference. As a result of such interference, the optical modulator can load signals on the light beam by regulating the quantity of the reflected or diffracted light.

Although the foregoing describes the cases in which the gap between the ribbon structure 140 and the insulation layer 120 on which the lower reflective layer 120(a), 120(b) is formed corresponds to $(2n)\lambda/4$ or $(2n+1)\lambda/4$, it is obvious that a variety of embodiments, in which the amount of reflected or diffracted light is controlled according to the size of the gap, can be applied to the present invention.

The descriptions below will focus on the type of optical modulator illustrated in FIG. 2A. Hereinafter, both 0th order diffracted light (reflected light) and +nth and −nth order diffracted lights will be called a modulated light.

Figure 2C:
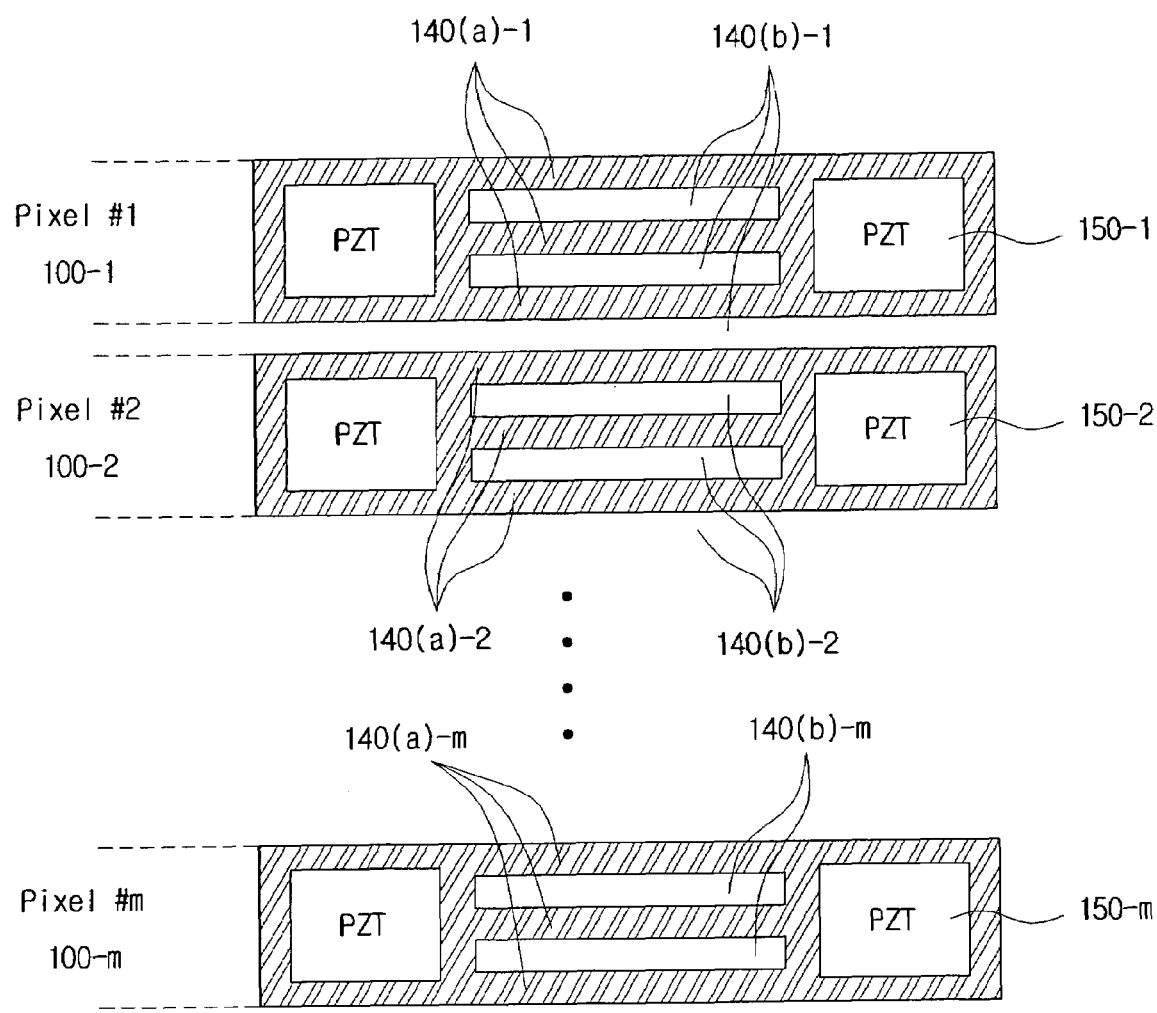

As shown in FIG. 2C, the optical modulator has an m number of micro-mirrors 100-1, 100-2, . . . , and 100-m, respectively responsible for pixel #1, pixel #2, . . . , and pixel #m. The optical modulator deals with image information with respect to one-dimensional images of vertical or horizontal scanning lines (Here, it is assumed that a vertical or horizontal scanning line consists of an m number of pixels), and each micro-mirror 100-1, 100-2, . . . , 100-m deals with one of the m pixels constituting the vertical or horizontal scanning line. Accordingly, the light beam reflected and diffracted by each micro-mirror is later projected by an optical scanning device on a screen as a two-dimensional image. For instance, in the case of VGA 640*480 resolution, 480 vertical pixels are modulated 640 times on one surface of the optical scanning device (not shown in the accompanying drawings) so as to produce one frame per surface of the optical scanning device. Here, the optical scanning device may be a polygon mirror, a rotating bar, or a galvano mirror.

Below here, although the principle of optical modulation will be set forth with an example of the pixel #1, the following description can be applied to the other pixels in the same way.

In the present embodiment, it is assumed that two holes 140(b)-1 are formed in the ribbon structure 140. Due to the two holes 140(b)-1, there are three upper reflective layers 140(a)-1 formed on the upper part of the ribbon structure 140. On the insulation layer 130 are formed two lower reflective layers in correspondence with the two holes 140(b)-1. Besides, another lower reflective layer is formed on the insulation layer 120 in correspondence with a gap between the pixel #1 and the pixel #2. Consequently, per pixel, the number of the upper reflective layers 140(a)-1 is the same as the number of the lower reflective layers, and the brightness of the modulated light can be controlled by using the modulated light (0th order diffracted light or ±1st order diffracted light).

Figure 2D:
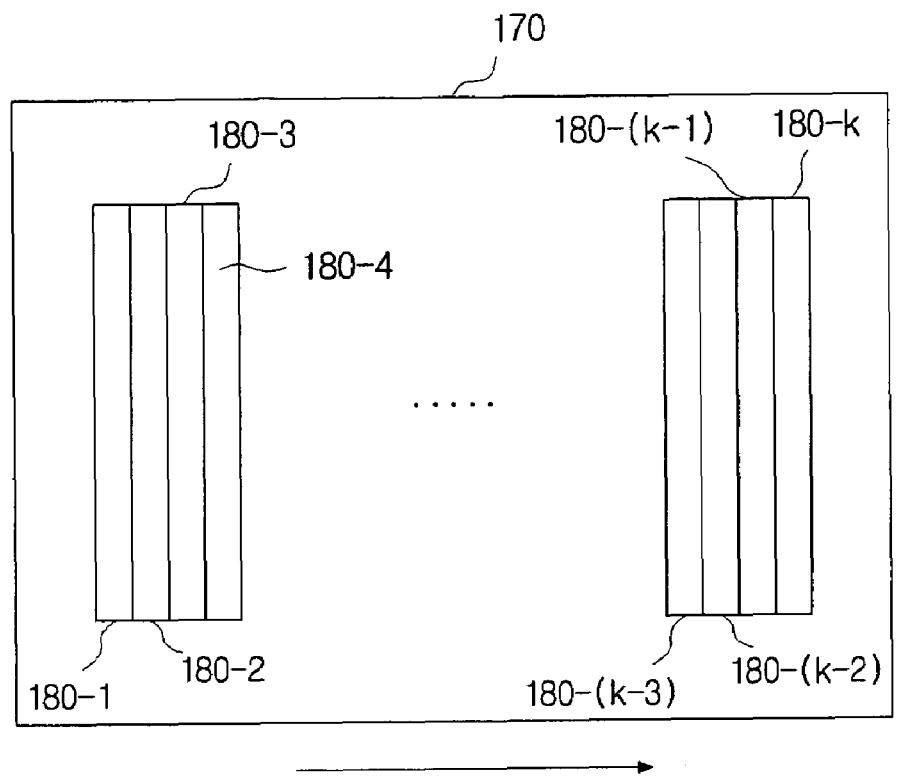

FIG. 2D is a schematic diagram showing an image generated on a screen by a diffraction type optical modulator array applicable to the embodiments of the present invention.

The light beam reflected and diffracted by an m number of vertically arranged micro-mirrors 100-1, 100-2, . . . , and 100-m is reflected from the optical scanning device, and then scanned horizontally on a screen 170, thereby generating images 180-1, 180-2, 180-3, 180-4, . . . , 180-(k-3), 180-(k-2), 180-(k-1), and 180-k. One image frame may be projected with one revolution of the optical scanning device. Although the scanning starts from the left to the right (the direction of the arrow) in FIG. 2D, the scanning may be performed in the opposite direction.

The following will describe in detail, including the light modulator illustrated in FIGS. 2A and 2B, an optical modulator module having a high degree of freedom in shaping a module.

An optical modulator module according to the present invention comprises an optical modulator element, a driving integrated circuit, a flexible printed circuit board, and a transparent substrate.

The flexible printed circuit board has a circuit formed thereon or therein, and receives control signals from the outside. The flexible printed circuit board is bendable due to the flexibility, thus showing a high degree of freedom when it should be mounted on a limited space.

The optical modulator element modulates incident light according to a driving voltage, and sends out the modulated light. As described in FIGS. 2A to 2D, the optical modulator element can modulate the incident light according to the driving voltage supplied to piezoelectric elements 150 by employing a micro-mirror.

The incident light inputted into the optical modulator element and the modulated light sent out from the optical modulator element pass through the transparent substrate. Transparent materials of high quality (for example, glass) are recommended for the transparent substrate so that the incident light can pass therethrough with little disturbance.

The driving integrated circuit is electrically connected with the flexible printed circuit board, thereby receiving control signals inputted from the outside from the flexible printed circuit board. The driving integrated circuit generates driving power according to the control signals and provides the power to the optical modulator element. The driving integrated circuit receives input signals from an external control board, and generates output signals corresponding thereto. The driving integrated circuit has more output terminals providing driving power than input terminals receiving control signals, so that it can control the output signals outnumbering the inputted signals. That means that there are more circuit patterns electrically connected to the optical modulator element than circuit patterns electrically connected to the flexible printed circuit board. It is preferable that the number of the circuit patterns electrically connected to the optical modulator element corresponds to the number of the micro-mirrors constituting the optical modulator element.

The flexible printed circuit board receives electric signals from an external control circuit, and transmits such signals to the optical modulator element and the driving integrated circuit.

In the following are described embodiments of the optical modulator module according to the present invention with reference to the accompanying drawings.

Figure 3:
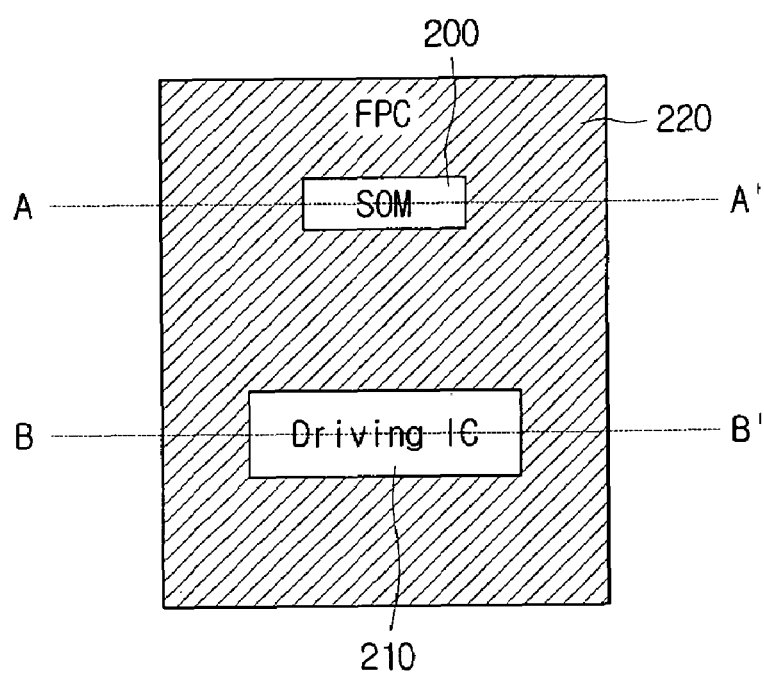
FIG. 3 is a plan view of an optical modulator module according to a first embodiment of the present invention.
Figure 4:
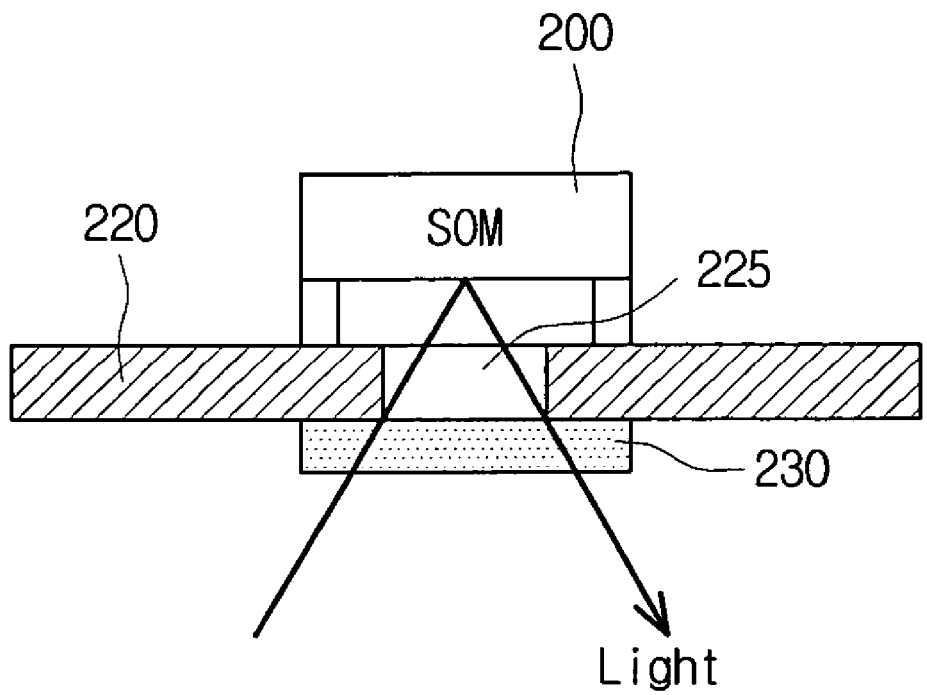
FIGS. 4(a) and 4(b) respectively show cross-sectional views along the lines AA' and BB' of FIG. 3.
Figure 4:
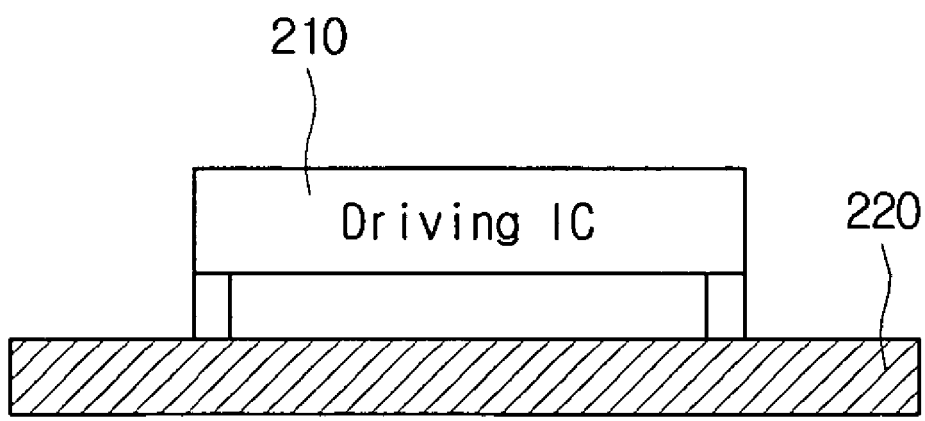

FIG. 3 is a plan view of an optical modulator module according to an embodiment of the present invention, FIGS. 4(*a*) and 4(*b*) respectively show cross-sectional views of the optical modulator module in FIG. 3 along the lines AA' and BB'. As shown in FIGS. 3 and 4, the optical modulator module comprises an optical modulator element 200, a driving integrated circuit 210, a flexible printed circuit board 220, and a transparent substrate 230.

On the internal and/or external layers of the flexible printed circuit board 220 is formed an electric wiring or a circuit pattern (hereinafter, referred to as 'circuit pattern'), so as to transmit control signals receiving through a connector (not shown in the drawings) from an external control circuit (for example, a control board) to the driving integrated circuit 210. The driving integrated circuit 210 is electrically connected by flip-chip bonding to the flexible printed circuit board 220. On the part of the flexible printed circuit board 220 to which the optical modulator element 200 corresponds is formed a hole 225, through which light beams go into or out from the optical modulator element 200.

Bendable flexibility is one of the properties of the flexible printed circuit board 220.

The transparent substrate 230 may be preferably formed of such transparent material of high quality (for example, glass substrate with anti-reflective coating on the both sides) that projected incident light reaches the optical modulator element 200 with little disturbance. The transparent substrate 230 is attached to the other side of the flexible printed circuit board 220 to the opposite side of which the optical modulator element 200 is attached. As shown in FIG. 4(*a*), the incident light passes through the transparent substrate 230, and reaches the optical modulator element 200 through the hole 225 of the flexible printed circuit board 220. Subsequently, after modulated by the optical modulator element 200, the modulated light exits through the same hole 225. The portion of the substrate 230 in registry with the hole 225 is transparent; however, the remainder of the substrate need not be transparent, though from a manufacturing point of view, it may be most practical if the entire substrate were homogeneous, and thus transparent.

Since the transparent substrate 230 is rigid, attaching it in entirety to the flexible printed circuit board 220 lowers the degree of freedom. Therefore, as shown in FIG. 4(*a*), it is preferable that the transparent substrate 230 be attached, with a proper size, to the position to which the optical modulator element 200 and the hole 225 of the flexible printed circuit board 220 correspond.

The transparent substrate 230 may be coated with multiple layers capable of preventing the incident light from being reflected on the surface. Either or both sides of the transparent substrate 230 may be anti-reflectively coated to reduce unwanted radiation and reflection.

The transparent substrate 230 also protects the ribbon structured 140 of the MEMS structure in the optical modulator element 200, namely the micro-mirror from the external environment. The optical modulator element 200 in FIG. 4(*a*) exhibits the case in which the MEMS structure in FIGS. 2A and 2B is attached with its upside down. Accordingly, the ribbon structure 140 faces downward, and is disposed opposite to the transparent substrate 230, the hole 225 of the flexible printed circuit board 220 being sandwiched therebetween. Here, the hole 225 is hermetically sealed by the transparent substrate 230, so that the ribbon structure 140 is protected from the external environment.

The optical modulator element 200 is attached to the area where the hole 225 of the flexible printed circuit board 220 is disposed, and sends out the modulated light generated by modulating the incident light. It is preferable that the hole 225 be smaller than the optical modulator element 200. The optical modulator element 200 is electrically connected by flip-chip bonding to the flexible printed circuit board 220.

In general, the optical modulator element 200 has an oblong shape in cross section.

The driving integrated circuit 210 is connected by flip-chip bonding near the optical modulator element 200 attached to the flexible printed circuit board 220, and supplies the optical modulator element 200 with driving voltage according to the control signals from the outside. This driving voltage causes changes in the intensity of the modulated light emitted from the MEMS structure shown in FIGS. 2A and 2B, and enables signals to be loaded on the light.

The driving integrated circuit 210 has an oblong shape in cross section, and the number of the driving integrated circuit 210 may vary if necessary.

Figure 5:
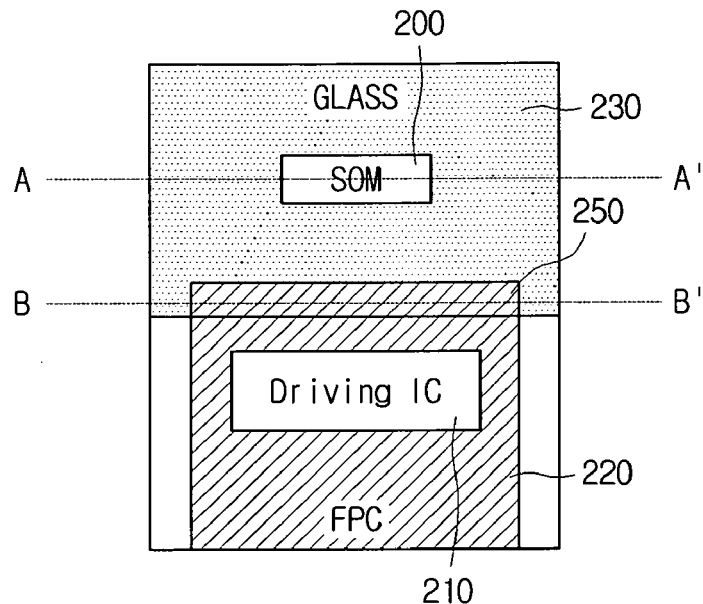
FIG. 5 is a plan view of an optical modulator module according to a second embodiment of the present invention.
Figure 6:
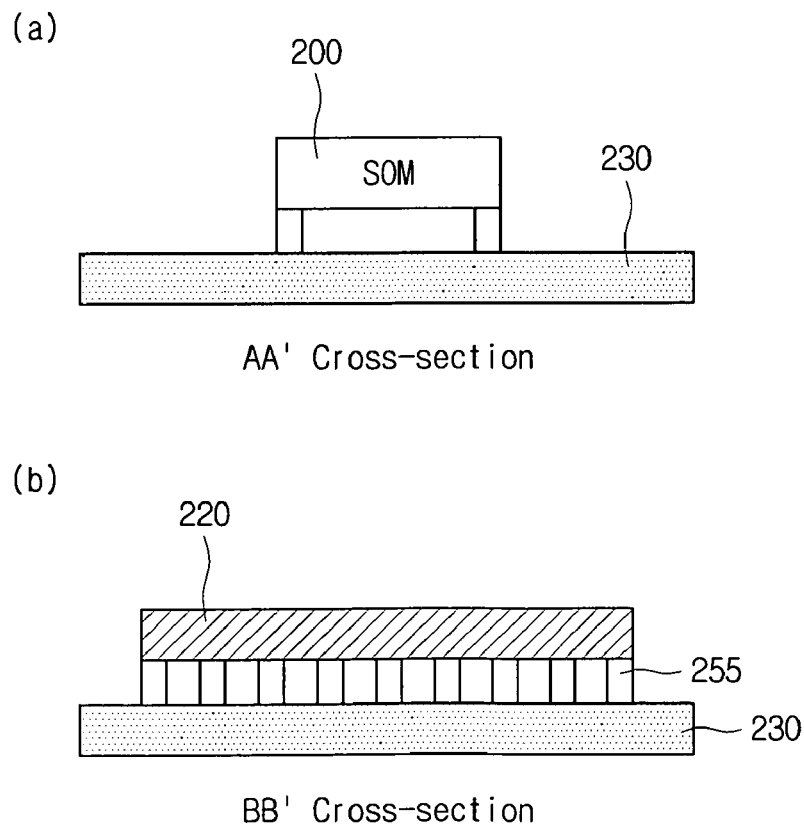
FIGS. 6(a) and 6(b) respectively show cross-sectional views along the lines AA' and BB' of FIG. 5.

FIG. 5 is a plan view of an optical modulator module according to a second embodiment of the present invention, and FIGS. 6(*a*) and 6(*b*) respectively show cross-sectional views of the optical modulator module in FIG. 5 along the lines AA' and BB'.

As shown in FIGS. 5 and 6, the optical modulator module comprises the optical modulator element 200, the driving integrated circuit 210, the flexible printed circuit board 220 and the transparent substrate 230.

The flexible printed circuit board 220 has a circuit pattern formed on its internal and/or external layers, thereby transmitting control signals, inputted through a connector (not shown in the accompanying drawings) from an external control circuit, to the driving integrated circuit 210. The driving integrated circuit 210 is electrically connected by flip-chip bonding to the flexible printed circuit board 220 to receive the control signals. The flexible printed circuit board 220 is bendably flexible.

The transparent substrate 230 may be preferably formed of such transparent material of high quality (for example, glass substrate with anti-reflective coating on the both sides) that projected incident light reaches the optical modulator element 200 with little disturbance. On the transparent substrate 230 is mounted the optical modulator element 200. A circuit pattern is formed on a surface of the transparent substrate 230 so that transparent substrate 230 is electrically connected to the optical modulator element 200.

The transparent substrate 230 partly overlaps the flexible printed circuit board 220 as shown in FIG. 5. The circuit pattern of the flexible printed circuit board 220 is laid over the circuit pattern of the transparent substrate 230 in the overlapped part. Referring to FIG. 6(*b*), the overlapped part uses an anisotropic conductive film (ACF), a nonconductive film (NCF), or soldering to electrically connect the transparent substrate 230 and the flexible printed circuit board 220. Among these, connecting by using the anisotropic conductive film (ACF) is called tape automated bonding (TAB) or film on glass (FOG) process. In other words, as shown in FIG. 6(*b*), the flexible printed circuit board 220 can be TAB-bonded to the transparent substrate 230 by using the anisotropic conductive film (ACF). Otherwise, wire-bonding may be employed for the electric connecting.

The transparent substrate 230 may be coated with multiple layers capable of preventing the incident light from being reflected on the surface. Either or both sides of the transparent substrate 230 may be anti-reflectively coated to reduce unwanted radiation and reflection.

The optical modulator element 200 is attached to a predetermined part of the transparent substrate 230, preferably, to the center part, and modulates incident light, and sends out the modulated light. The optical modulator element 200 is electrically connected by flip-chip bonding to the transparent substrate 230.

In general, the optical modulator element 200 has an oblong shape in cross section.

The driving integrated circuit 210 is connected by flip-chip bonding to the flexible printed circuit board 220, and supplies, according to control signals inputted from the outside, driving voltage to the optical modulator element 200.

Electric signals corresponding to the driving voltage and outputted from the driving integrated circuit 210 are transmitted along the circuit pattern of the flexible printed circuit board 220 to the overlapped part, and then transmitted again to the transparent substrate 230 connected by the anisotropic conductive film (ACF), the nonconductive film (NCF), or the soldering, and then is transported through the electric wiring or the circuit pattern formed on the transparent substrate 230 to the optical modulator element 200.

Also, the driving integrated circuit 210 has an oblong shape in cross section, and the number of the driving integrated circuit 210 may vary if necessary.

Figure 7:
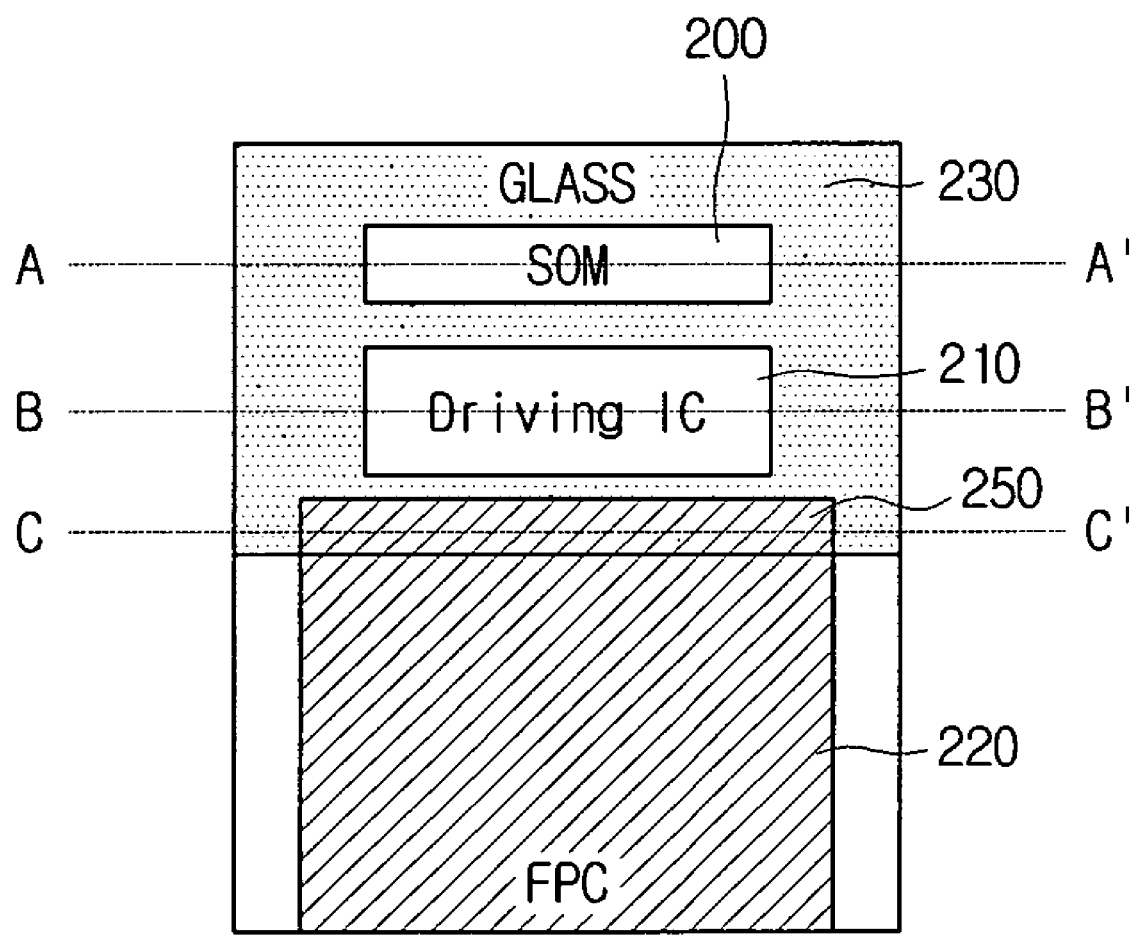
FIG. 7 is a plan view of an optical modulator module according to a third embodiment of the present invention.
Figure 8:
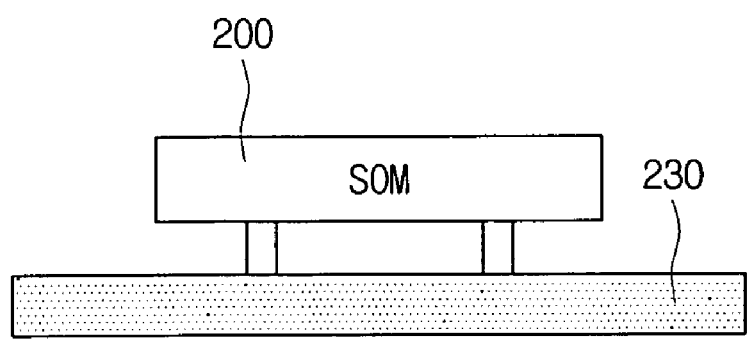
FIGS. 8(a), 8(b), and 8(c) respectively show cross-sectional views along the lines AA', BB', and CC' of the FIG. 7.
Figure 8:
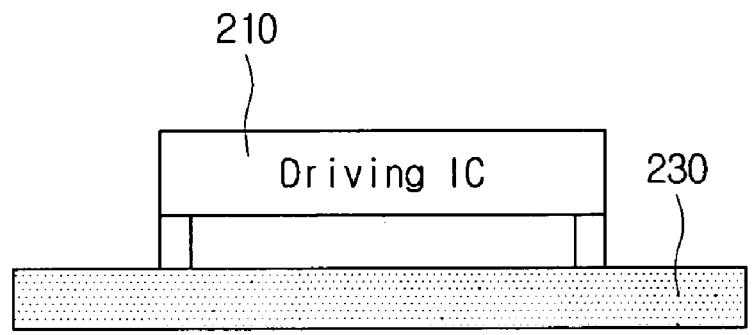
Figure 8:
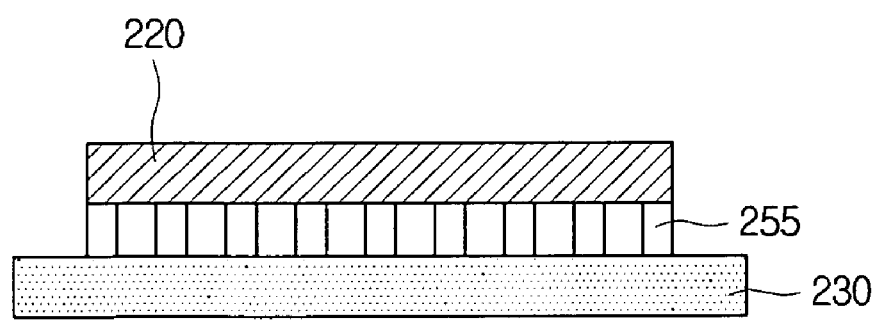

FIG. 7 is a plan view of an optical modulator module according to a third embodiment of the present invention, and FIGS. 8(*a*), 8(*b*) and 8(*c*) respectively show cross-sectional views of the optical modulator module in FIG. 7 along the lines AA', BB', and CC'. As shown in FIGS. 7 and 8, the optical modulator module comprises an optical modulator element 200, a driving integrated circuit 210, a flexible printed circuit board 220 and a transparent substrate 230.

The flexible printed circuit board 220 has a circuit pattern formed on its internal and/or external layers, thereby transmitting control signals, inputted through a connector (not shown in the accompanying drawings) from an external control circuit, to the driving integrated circuit 210. The flexible printed circuit board 220 is bendably flexible.

The transparent substrate 230 may be preferably formed of such transparent material of high quality (for example, glass) that projected incident light reaches the optical modulator element 200 with little disturbance. On the transparent substrate 230 are attached the optical modulator element 200 and the driving integrated circuit 210. A circuit pattern is formed on a surface of the transparent substrate 230 so that transparent substrate 230 is electrically connected with the optical modulator element 200 and the driving integrated circuit 210.

The transparent substrate 230 partly overlaps the flexible printed circuit board 220 as shown in FIG. 7. As shown in FIG. 8(*c*), the overlapped part uses an anisotropic conductive film (ACF), a nonconductive film (NCF), or soldering to electrically connect the transparent substrate 230 and the flexible printed circuit board 220. The TAB-bonding is preferably used to connect the transparent substrate 230 and the flexible printed circuit board 220. Otherwise, wire-bonding may be employed for the electric connecting.

The transparent substrate 230 may be coated with multiple layers capable of preventing the incident light from being reflected on the surface. Either or both sides of the transparent substrate 230 may be anti-reflectively coated to reduce unwanted radiation and reflection.

The optical modulator element 200 is attached to a predetermined part of the transparent substrate 230, preferably, to the center part, and modulates incident light, and sends out the modulated light. The optical modulator element 200 is electrically connected by flip-chip bonding to the transparent substrate 230.

In general, the optical modulator element 200 has an oblong shape in cross section.

The driving integrated circuit 210 is connected by flip-chip bonding near the optical modulator element 200 attached to the transparent substrate 230, and supplies, according to control signals inputted from the outside, driving voltage to the optical modulator element 200.

The flexible printed circuit 220 receives the control signals, and transmits them through the circuit pattern of the flexible printed circuit 220 to the overlapped part. The control signals are then transmitted again to the transparent substrate 230 connected by the anisotropic conductive film (ACF), the nonconductive film (NCF), or soldering, and then are transported through the electric wiring or the circuit pattern formed on the transparent substrate 230 to the optical modulator element 200.

Also, the driving integrated circuit 210 has an oblong shape in cross section, and the number of the driving integrated circuit 210 may vary if necessary.

The driving integrated circuit 210 has more output terminals providing driving power than input terminals receiving control signals, so that it can control the output signals outnumbering the inputted signals. That means that there are more circuit patterns 260 electrically connected to the optical modulator element than circuit patterns 270 electrically connected to the flexible printed circuit board. It is preferable that the number of the circuit patterns 260 electrically connected to the optical modulator element corresponds to the number of the micro-mirrors constituting the optical modulator element.

A fine pitch circuit pattern can be performed on the transparent substrate 230 more delicately than on the flexible printed circuit board 220. The input terminals of the driving integrated circuit 210 is electrically connected toward the flexible printed circuit board 220, on which fine pitch circuits are difficult to form, and the output terminals of the driving integrated circuit 210 are electrically connected toward the transparent substrate 230, on which fine pitch circuits are easier to form, to reduce the gap between the optical modulator element 200 and the driving integrated circuit 210, by which the optical modulator module can be microminiaturized.

Figure 9:
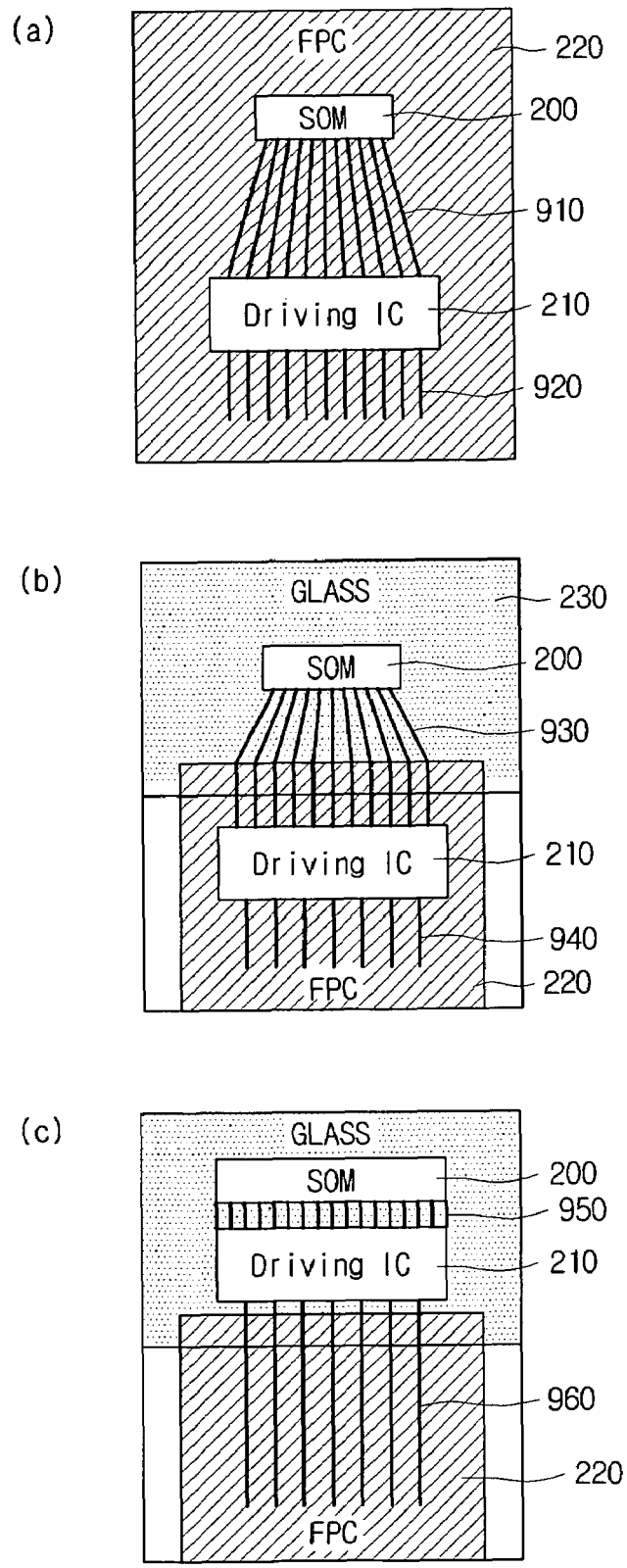
FIGS. 9(a), 9(b), and 9(c) illustrate a fine pitch wiring between an optical modulator element and a driving integrated circuit according to an embodiment of the present invention.

FIGS. 9(*a*) to 9(*c*) illustrate a fine pitch wiring between an optical modulator element 200 and a driving integrated circuit 210 according to an embodiment of the present invention.

Forming a fine pitch wiring on the flexible printed circuit board 220 is more difficult than forming on the transparent substrate 230. A standard semiconductor thin film process is employed to fabricate the fine pitch wiring on the transparent substrate 230 (especially, glass substrate), thus a fine pitch wiring smaller than 16 μm can be formed on the transparent substrate 230, especially on a glass substrate. That is because the transparent substrate 230 has a level surface, and is thermally stable enough to endure the semiconductor process, and adheres strongly to a semiconductor thin-film.

FIG. 9(*a*) illustrates a circuit pattern and a pitch according to the embodiment introduced in FIG. 3. Both the optical modulator element 200 and the driving integrated circuit 210 are attached to the flexible printed circuit board 220, the optical modulator element 200 is smaller than the driving integrated circuit 210. Accordingly, a first circuit pattern 910 formed between the optical modulator element 200 and the driving integrated circuit 210 widens to the driving integrated circuit 210. The driving integrated circuit 210 receives electric signals from an external control circuit, namely a control board through a second circuit pattern 920.

FIG. 9(*b*) illustrates a circuit pattern and a pitch according to the embodiment introduced in FIG. 5. The optical modulator element 200 is attached alone onto the transparent substrate 230. While about 16 μm-size of fine pitch can be performed on the transparent substrate 230 for a first circuit pattern 930 between the optical modulator element 200 and the driving integrated circuit 210, such fine pitch can not be performed on the flexible printed circuit board 220. Thus, starting from the overlapped part, the first circuit pattern 930 is becoming narrower to the optical modulator element 200.

FIG. 9(*c*) illustrates a circuit pattern and a pitch according to the embodiment introduced in FIG. 7. Both the optical modulator element 200 and the driving integrated circuit 210 are attached onto the transparent substrate 230. Because a fine pitch of about 16 μm-size can be performed on the transparent substrate 230, a first circuit pattern 950 between the optical modulator element 200 and the driving integrated circuit 210 may have a much narrower width than that of FIGS. 9(*a*) and 9(*b*). A second circuit pattern 960 receiving electric signals form an external control circuit can have a wider pitch than the first circuit pattern 950 due to the feature that the driving integrated circuit 210 has more output terminals than input terminals. Therefore, the pitch can be optimized on the flexible printed circuit board 220. More specifically, the first circuit pattern 950 may have about 16 μm-size fine pitch on the transparent substrate 230, while the second circuit pattern 960 may have about 30 μm-size fine pitch on the flexible printed circuit board 220.

The embodiment illustrated in FIG. 9(*c*) is advantageous in miniaturization, because the pitch of the first circuit pattern, between the optical modulator element 200 and the driving integrated circuit 210, has a small size.

Figure 10:
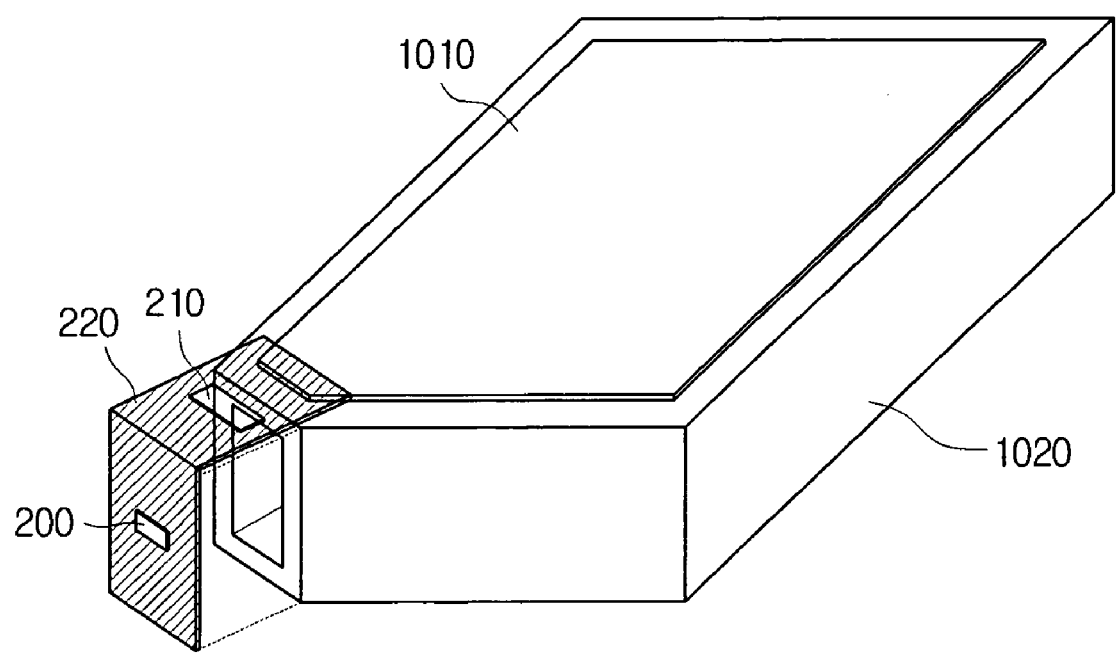
FIG. 10 illustrates an optical device comprising the optical modulator module of the FIG. 3.

FIG. 10 shows an optical device comprising the optical modulator module pictured in FIG. 3.

As shown in FIG. 10, a flexible circuit board 220, to which an optical modulator element 200 and a driving integrated circuit 210 are attached, is electrically connected to a control board 1010. An optical device module 1020 comprises the control board 1010, a light source, and an optical lens.

By exercising bendability of the flexible printed circuit board 220, an electric device with a limited space therein, like a cellular phone, can save its space.

While the invention has been described with reference to the disclosed embodiments, it is to be appreciated that those skilled in the art can change or modify the embodiments without departing from the scope and spirit of the invention or its equivalents as stated below in the claims.

The invention claimed is:

1. An optical modulator module comprising:
   a bendable flexible printed circuit board in which a circuit pattern is formed, and to which control signals are inputted from the outside;
   an optical modulator element modulating an incident light according to a driving voltage and sending out the modulated light;
   a transparent substrate through which the incident light and the modulated light pass, and in which a circuit pattern is formed; and
   a driving integrated circuit electrically connected with the flexible printed circuit board, and supplying the optical modulator element with the driving voltage according to the inputted control signals,
   wherein the flexible printed circuit board is electrically connected with the transparent substrate, and
   wherein the optical modulator element and the driving integrated circuit are attached to one side of the flexible printed circuit board, and the transparent substrate is attached to the other side of the flexible printed circuit board in correspondence with a position where the optical modulator element is attached, and a hole, through which the incident light and the modulated light pass, is formed on the part of the flexible printed circuit board to which the optical modulator element is attached.

2. The optical modulator module of claim 1, wherein the optical modulator element and the driving integrated circuit are connected by flip-chip bonding with the flexible printed circuit board.

3. An optical modulator module comprising:
   a bendable flexible printed circuit board in which a circuit pattern is formed, and to which control signals are inputted from the outside;
   an optical modulator element modulating an incident light according to a driving voltage and sending out the modulated light;
   a transparent substrate through which the incident light and the modulated light pass, and in which a circuit pattern is formed; and
   a driving integrated circuit electrically connected with the flexible printed circuit board, and supplying the optical modulator element with the driving voltage according to the inputted control signals,
   wherein the flexible printed circuit board is electrically connected with the transparent substrate, and
   wherein the optical modulator element is attached to the transparent substrate, and the driving integrated circuit is attached to the flexible printed circuit board, and the circuit pattern of the transparent substrate is partly overlapped with the circuit pattern of the flexible printed circuit board.

4. The optical modulator module of claim 3, wherein the overlapped part is electrically connected by means of an anisotropic conductive film (ACF), a non conductive film (NCF), or soldering.

5. An optical modulator module comprising:
- a bendable flexible printed circuit board in which a circuit pattern is formed, and to which control signals are inputted from the outside;
- an optical modulator element modulating an incident light according to a driving voltage and sending out the modulated light;
- a transparent substrate through which the incident light and the modulated light pass, and in which a circuit pattern is formed; and
- a driving integrated circuit electrically connected with the flexible printed circuit board, and supplying the optical modulator element with the driving voltage according to the inputted control signals,
- wherein the flexible printed circuit board is electrically connected with the transparent substrate, and
- wherein the optical modulator element and the driving integrated circuit are attached to the transparent substrate, and the circuit pattern of the transparent substrate is overlapped with the circuit pattern of the flexible printed circuit board on a predetermined part.

6. The optical modulator module of claim 5, wherein the overlapped part is electrically connected by means of an anisotropic conductive film (ACF), a non conductive film (NCF), or soldering.

7. The optical modulator module of claim 5, wherein the driving integrated circuit has input terminals to which the control signals are inputted and output terminals through which the driving voltage is outputted, wherein the output terminals outnumber the input terminals, and the input terminals are connected to the circuit pattern formed on the flexible printed circuit board, and the output terminals are connected to the circuit pattern formed on the transparent substrate.

* * * * *